(12) United States Patent
Frank et al.

(10) Patent No.: US 11,462,398 B2
(45) Date of Patent: Oct. 4, 2022

(54) LIGAND SELECTION FOR TERNARY OXIDE THIN FILMS

(71) Applicants: International Business Machines Corporation, Armonk, NY (US); ULVAC, Inc., Kanagawa (JP)

(72) Inventors: Martin Michael Frank, Dobbs Ferry, NY (US); John Rozen, Hastings on Hudson, NY (US); Yohei Ogawa, White Plains, NY (US)

(73) Assignees: INTERNATIONAL BUSINESS MACHINES CORPORATION, Armonk, NY (US); ULVAC, INC, Kanagawa (JP)

( * ) Notice: Subject to any disclaimer, the term of this patent is extended or adjusted under 35 U.S.C. 154(b) by 182 days.

(21) Appl. No.: 16/514,351

(22) Filed: Jul. 17, 2019

(65) Prior Publication Data
US 2021/0020426 A1  Jan. 21, 2021

(51) Int. Cl.
*H01L 21/02* (2006.01)
*H01L 29/788* (2006.01)
*H01L 29/78* (2006.01)
*H01L 45/00* (2006.01)

(52) U.S. Cl.
CPC .... *H01L 21/0228* (2013.01); *H01L 21/02181* (2013.01); *H01L 21/02189* (2013.01); *H01L 21/02205* (2013.01); *H01L 29/788* (2013.01); *H01L 29/78391* (2014.09); *H01L 45/08* (2013.01); *H01L 45/145* (2013.01)

(58) Field of Classification Search
CPC .................................................. H01L 21/0228
See application file for complete search history.

(56) References Cited

U.S. PATENT DOCUMENTS

| | | | |
|---|---|---|---|
| 6,815,350 B2 | 11/2004 | Kim et al. | |
| 6,984,591 B1 * | 1/2006 | Buchanan | C23C 16/45531 438/778 |
| 7,112,485 B2 | 9/2006 | Vaartstra | |

(Continued)

OTHER PUBLICATIONS

D. Tsoutsou et al., "Atomic layer deposition of La x Zr 1—x O 2—δ (x= 0.25) high-k dielectrics for advanced gate stacks," Applied Physics Letters, vol. 94, No. 5, 2009, 053504, 3 pp.

(Continued)

*Primary Examiner* — Abul Kalam
(74) *Attorney, Agent, or Firm* — Cantor Colburn LLP; Robert Sullivan

(57) ABSTRACT

Embodiments of the present invention are directed to forming a ternary compound using a modified atomic layer deposition (ALD) process. In a non-limiting embodiment of the invention, a first precursor and a second precursor are selected. The first precursor includes a first metal and a first ligand. The second precursor includes a second metal and a second ligand. The second ligand is selected based on the first ligand to target a second metal uptake. A substrate is exposed to the first precursor during a first pulse of an ALD cycle and the substrate is exposed to the second precursor during a second pulse of the ALD cycle, the second pulse occurring after the first pulse. The substrate is exposed to a (Continued)

third precursor (e.g., an oxidant) during a third pulse of the ALD cycle. The ternary compound can include a ternary oxide film.

9 Claims, 10 Drawing Sheets

(56) References Cited

U.S. PATENT DOCUMENTS

| | | | |
|---|---|---|---|
| 7,560,395 | B2 | 7/2009 | Ahn et al. |
| 7,662,729 | B2* | 2/2010 | Ahn ................ H01L 21/28079 438/785 |
| 8,016,945 | B2 | 9/2011 | Zilbauer et al. |
| 8,685,815 | B2 | 4/2014 | Ahn et al. |
| 11,081,343 | B2* | 8/2021 | Rozen ............... H01L 21/02183 |
| 2003/0176065 | A1* | 9/2003 | Vaartstra ........... H01L 21/28562 438/688 |
| 2004/0043635 | A1* | 3/2004 | Vaartstra ............. H01L 21/0228 438/785 |
| 2004/0168627 | A1* | 9/2004 | Conley, Jr. ............. C30B 29/16 117/89 |
| 2006/0046521 | A1* | 3/2006 | Vaartstra ............. H01L 21/3141 438/778 |
| 2014/0011353 | A1 | 1/2014 | Ikegawa |
| 2015/0255267 | A1 | 9/2015 | Tapily |
| 2018/0151354 | A1 | 5/2018 | Dussarrat et al. |
| 2021/0020427 | A1* | 1/2021 | Rozen ................. H01L 21/0228 |

OTHER PUBLICATIONS

J. F. Conley Jr. et al., "Pulsed deposition of metal-oxide thin films using dual metal precursors." Applied Physics Letters, vol. 84, No. 3, 2004, pp. 398-400.

Ji-Hoon Ahn et al., "Enhanced electrical properties of Hf-aluminate thin films by crystal structure modulation," Materials Letters, vol. 157, 2015, pp. 215-218.

Miika Mattinen et al., "Atomic Layer Deposition of Molybdenum and Tungsten Oxide Thin Films Using Heteroleptic Imido-Amidinato Precursors: Process Development, Film Characterization, and Gas Sensing Properties," Chemistry of Materials, vol. 30, No. 23, 2018, pp. 8690-8701.

Tapily et al., "Electrical Enhancement and Higher-K Engineering in Ultra-Thin Atomic Layer Deposit Hf1—xAlxOy Films," ECS, 4(2) (2015): pp. N1-N5.

* cited by examiner

Ligand Selection to Modify Second Metal (M2) Uptake In Ternary Oxide (Mixed Metal) Thin Films

| split | ID | M1 | M2 | Oxidizer | cycles | Ellipsometry | | | RBS | |
|---|---|---|---|---|---|---|---|---|---|---|
| | | | | | | Thickness(Å) | Uniformity (1 σ %) | | Hf | Zr |
| 1 | 121316HfO1 | HfCl4 | - | H2O | 80 | 51.2 | 2.8 | | 100.0 | 0.0 |
| 2 | 121418MHfO1 | TEMAH | - | H2O | 80 | 45.9 | 2.0 | | 100.0 | 0.0 |
| 3 | 121418MZrO1 | TEMAZ | - | H2O | 80 | 49.2 | 2.9 | | 1.8 | 98.2 |
| 4 | 121318DRHZO3 | HfCl4 | TEMAZ | H2O | 80 | 52.0 | 5.1 | | 84.4 | 15.6 |
| 5 | 121318DRHZO2 | TEMAZ | HfCl4 | H2O | 80 | 62.9 | 6.1 | | 48.6 | 51.4 |
| 6 | 121218MHZO4 | TEMAH | TEMAZ | H2O | 80 | 65.5 | 1.9 | | 70.4 | 29.6 |
| 7 | 121218MHZO6 | TEMAZ | TEMAH | H2O | 80 | 72.8 | 2.0 | | 27.2 | 72.8 |

Fig. 2

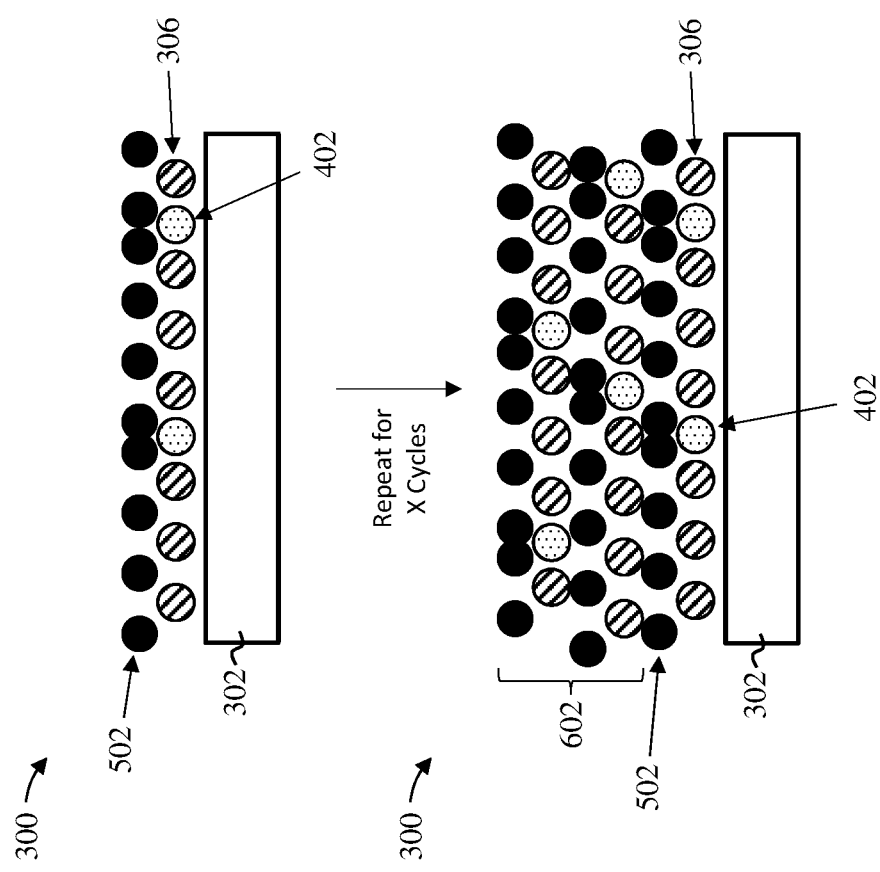

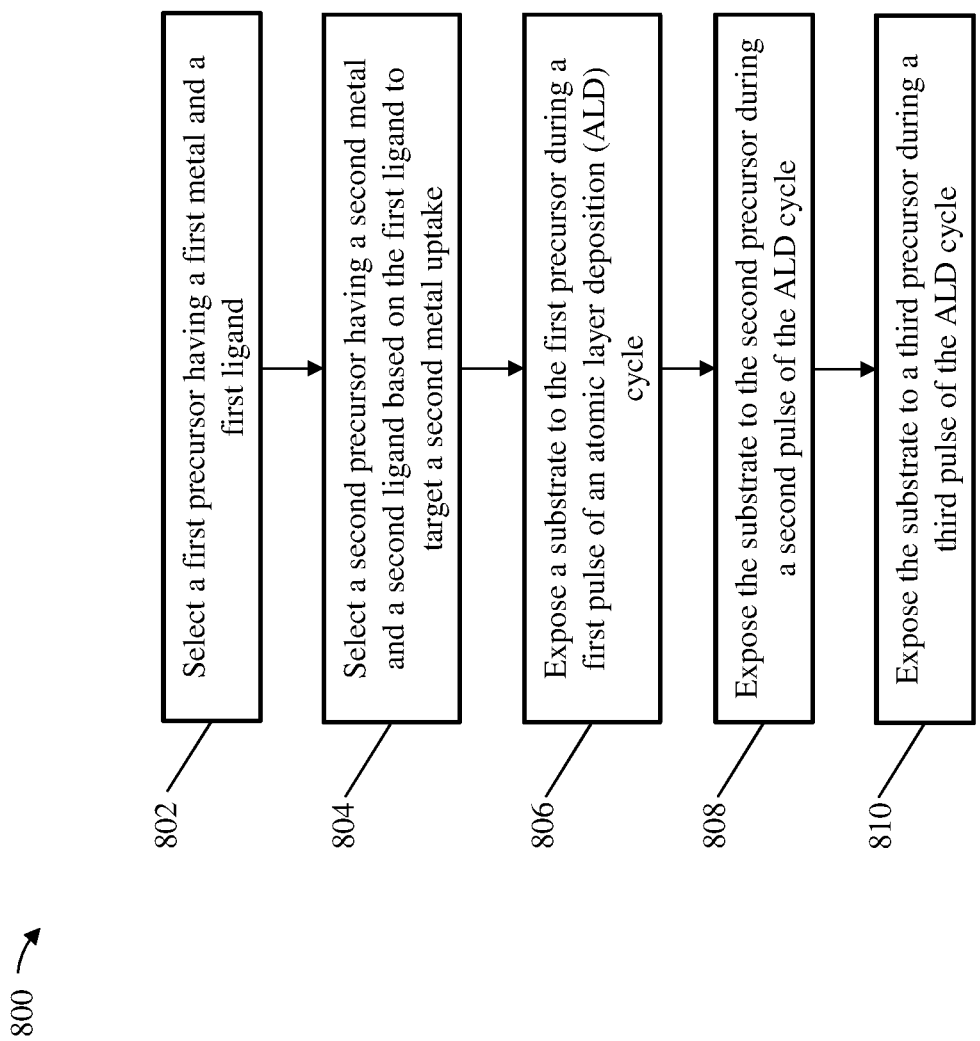

LIGAND SELECTION FOR TERNARY OXIDE THIN FILMS

BACKGROUND

The present invention generally relates to film deposition techniques. More specifically, the present invention relates to the selection of ligands when depositing ternary oxide (mixed metal-oxide) thin films.

The semiconductor industry is characterized by a trend toward fabricating larger and more complex circuits on a given semiconductor chip. The larger and more complex circuits are achieved by reducing the size of individual devices within the circuits and spacing the devices closer together. In recent years, high dielectric constant (high-k) materials have gradually replaced silicon dioxide as the insulating layer used in state-of-the-art CMOS fabrication technologies, including, for example, the CMOS fabrication technologies used to fabricate memory cells in a semiconductor memory device. Zirconium oxide (ZrO), for example, has a dielectric constant from about 24 to 40. To meet the scaling requirements for smaller and smaller devices, these high-k films must be deposited to increasingly lower thickness levels.

Atomic layer deposition (ALD) is a deposition technique uniquely suited for thin-film deposition. During ALD a film is grown on a substrate layer by layer by exposing the substrate surface to alternating gaseous species, typically referred to as precursors. The precursors are deposited during a series of sequential, non-overlapping pulses. In each of these pulses the precursor molecules react with the surface in a self-limiting way so that the reaction terminates once all the reactive sites on the surface are consumed. Consequently, the maximum amount of material deposited on the surface after a single exposure to all of the precursors (a so-called ALD cycle) is determined by the nature of the precursor-surface interaction. By varying the number of cycles, it is possible to grow materials uniformly and with high precision on arbitrarily complex and large substrates.

SUMMARY

Embodiments of the invention are directed to a method for forming a compound (e.g., a ternary oxide film) using a modified atomic layer deposition (ALD) process. A non-limiting example of the method includes selecting a first precursor and a second precursor. The first precursor can include a first metal and a first ligand. The second precursor can include a second metal and a second ligand. The second ligand is selected based on the first ligand to target a second metal uptake. A substrate can be exposed to the first precursor during a first pulse of an ALD cycle. The substrate can be exposed to the second precursor during a second pulse of the ALD cycle. The second pulse can occur directly after the first pulse without an intervening oxidant pulse. The substrate can be exposed to a third precursor during a third pulse of the ALD cycle. In some embodiments of the invention, the third precursor is an oxidant.

In some embodiments of the invention, the metal of the first precursor chemisorbs onto a surface of the substrate during the first pulse. In some embodiments of the invention, one or more adsorption sites remain open after the first pulse. In some embodiments of the invention, the metal of the second precursor chemisorbs onto the one or more open adsorption sites during the second pulse.

In some embodiments of the invention, the first ligand and the second ligand react during the second pulse to form one or more byproducts. In some embodiments of the invention, at least a portion of the one or more byproducts are removing using off-gassing.

In some embodiments of the invention, the second pulse occurs directly after the first pulse without an intervening pulse. In some embodiments of the invention, the second pulse occurs after the first pulse such that any intervening pulse is a non-reactive purge pulse. In some embodiments of the invention, a precursor partial pressure, gas flow, and pulse time are selected for at least one of the first pulse and the second pulse based on the target second metal uptake.

Embodiments of the invention are directed to a method for depositing a ternary oxide film. A non-limiting example of the method includes selecting a first metal and a second metal for the ternary oxide. A target second metal uptake (final second metal concentration in the film) is also selected for the ternary oxide. The method includes determining, based on the first metal and the second metal, one or more ligand pairs with known second metal uptakes. The method includes selecting, based on the target second metal uptake and the known second metal uptakes, a first ligand pair of the one or more ligand pairs. The first ligand pair includes a first ligand and a second ligand. The method includes exposing a substrate to an ALD cycle having a first precursor pulse, a second precursor pulse, and an oxidant pulse. The first precursor includes the first metal and the first ligand, and the second precursor includes the second metal and the second ligand.

In some embodiments of the invention, the method includes selecting, based on the target second metal uptake and the known second metal uptakes, a second ligand pair of the one or more ligand pairs. The second ligand pair includes a third ligand and a fourth ligand.

In some embodiments of the invention, the ALD cycle is a first ALD cycle and a first portion of the ternary oxide is formed using the first ALD cycle. In some embodiments of the invention, a second portion of the ternary oxide is formed using a second ALD cycle. In some embodiments of the invention, the second ALD cycle includes a third precursor pulse, a fourth precursor pulse, and an oxidant pulse. The third precursor includes the first metal and the third ligand and the fourth precursor includes the second metal and the fourth ligand.

In some embodiments of the invention, the ALD cycle is repeated one or more times.

In some embodiments of the invention, the first ligand is selected from a first class of ligands and the second ligand is selected from a second class of ligands different than the first class.

In some embodiments of the invention, the ternary oxide includes a ferroelectric phase or an anti-ferroelectric phase.

Embodiments of the invention are directed to a method for forming an electronic device. A non-limiting example of the method includes forming a bottom layer and forming a top electrode over the bottom layer. The method includes forming a ternary oxide film between the bottom layer and the top electrode. The ternary oxide film can be formed by exposing the bottom layer to an ALD cycle having a first precursor pulse, a second precursor pulse, and an oxidant pulse. The first precursor can include a first metal and a first ligand, and the second precursor can include a second metal and a second ligand. The second ligand can be selected based on the first ligand to target a second metal uptake.

In some embodiments of the invention, the ternary oxide film includes an active area of a resistive random-access memory (RRAM) or a gate dielectric layer of a floating gate flash memory.

In some embodiments of the invention, the ternary oxide film includes a thickness of less than about 2 nm and a second metal concentration of less than 15 percent. In some embodiments of the invention, the second metal is distributed throughout the ternary oxide film.

Embodiments of the invention are directed to a semiconductor structure. A non-limiting example of the semiconductor device includes a bottom layer, a top electrode, and a ternary oxide film between the bottom layer and the top electrode. The ternary oxide film can be formed by exposing the bottom layer to an ALD cycle having a first precursor pulse, a second precursor pulse, and an oxidant pulse. The first precursor can include a metal and a first ligand and the second precursor can include a second metal and a second ligand. The ternary oxide film can include a thickness of less than about 2 nm and a second metal concentration of less than 15 percent. The second metal can be distributed throughout the ternary oxide film.

In some embodiments of the invention, the second metal concentration is less than 6 percent, or less than 3 percent.

In some embodiments of the invention, the ternary oxide film includes a gate dielectric layer of a floating gate flash memory.

In some embodiments of the invention, the semiconductor material includes one or more of Si, Ge, SiGe, aSi:H, and InGaAs.

Embodiments of the invention are directed to a metal-insulator-metal device. A non-limiting example of the device includes a bottom electrode having a first metal, a top electrode having a second metal, and a ternary oxide film between the bottom electrode and the top electrode. The ternary oxide film can be formed by exposing the bottom layer to an ALD cycle having a first precursor pulse, a second precursor pulse, and an oxidant pulse. The first precursor can include a metal and a first ligand and the second precursor can include a second metal and a second ligand. The ternary oxide film can include a thickness of less than about 2 nm and a second metal concentration of less than 15 percent. The second metal can be distributed throughout the ternary oxide film.

In some embodiments of the invention, the bottom electrode includes a metal-nitride and the ternary oxide film includes $HfO_{2-x}$ or $Ta_2O_{3-x}$.

In some embodiments of the invention, the ternary oxide film includes one or more metal-metal bonds and one or more metal-nitride-metal bonds.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 depicts the selection of ligand combinations to target a specific second metal uptake in accordance with embodiments of the invention;

FIG. 6 depicts a cross-sectional view of the structure after fabrication operations in accordance with embodiments of the invention;

FIG. 8 depicts a flow diagram illustrating a method according to one or more embodiments of the invention;

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, current atomic layer deposition (ALD) techniques for depositing ternary oxides (e.g., M1M2O, with M1 being a first metal, M2 a second metal, and O an oxidant) combine several sequential M1L1-O1 and M2L2-O2 ALD cycles. Most conventional ALD supercyles also include an intervening oxidant pulse between the metal pulses. In this scheme, O1 oxidizes M1, removes some or all of the remaining L1 ligands, and can generate new ligands such as —OH that are reactive towards M2L2. In each cycle, a substrate is exposed to either the M1 or M2 precursor. The final ternary oxide stack is slowly built up by stacking the resulting M1 and M2 layers. While suitable for depositing ternary oxides having relatively equal M1 and M2 target concentrations, this implies that for a low target M2 content, a low cycle ratio has to be used (for precursors with similar number density at saturation), resulting in long, thick supercycles.

Figure 1:
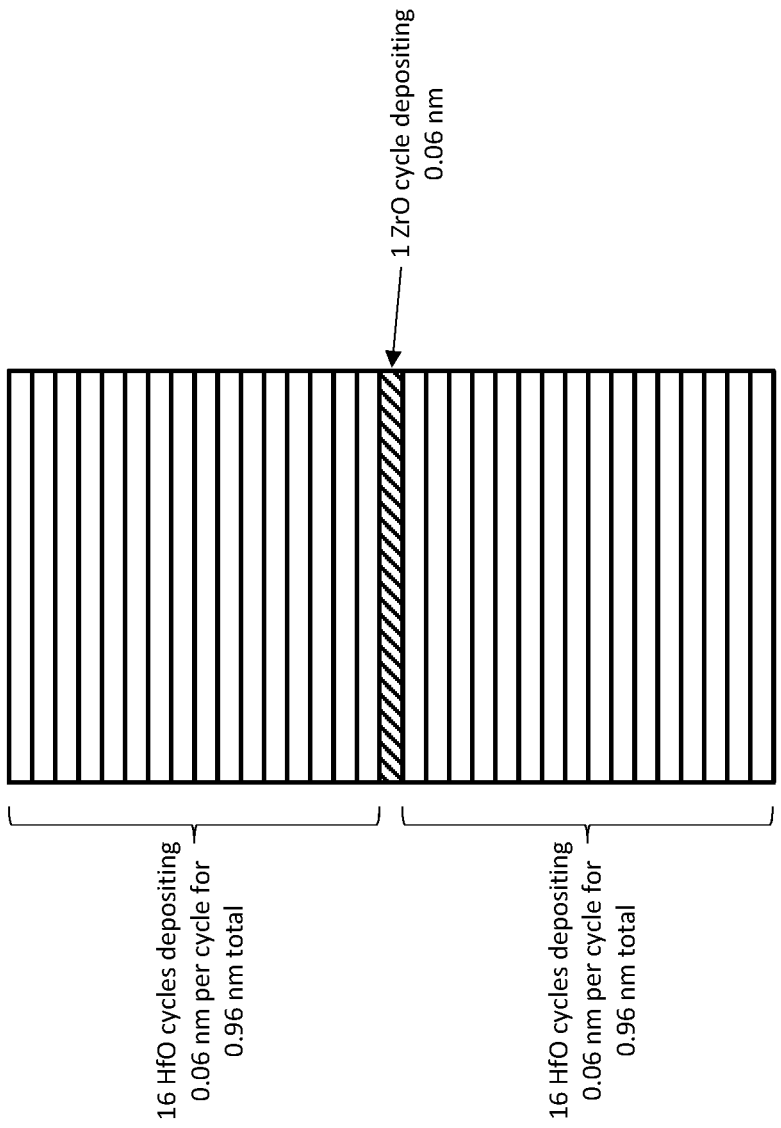
FIG. 1 depicts the growth of a ternary oxide using atomic layer deposition.

FIG. 1 illustrates growing a ternary oxide (HfZrO) with a low ~3 cation % Zr target using conventional ALD. In this case, supercycles of [16*(M1L1-O1)]-M2L2-O2-[16*(M1L1-O1)] have to be used, depositing about 2.0 nm per supercycle. In this example, M1L1 is TEMAH (tetrakis-ethylmethylamino (TEMA) and hafnium), M2L2 is TEMAZr, O1 is H2O, and O2 is oxygen. As shown in FIG. 1, achieving 3% Zr via ALD requires 32 HfO cycles and a single Zr cycle. The Zr cycle is typically placed between equal numbers of the HfO cycles. In this case, the Zr cycle occurs between two groups of 16 HfO cycles. Each cycle results in a growth or deposition of about 0.06 nm of material. Consequently, the final stack includes 32 HfO cycles having a total thickness of 1.92 nm and a single ZrO cycle having a total thickness of 0.06 nm, providing about 3.03% Zr.

There are several limitations inherent to the conventional ALD process. As shown in FIG. 1, the deposited film is a nanolaminate with highly non-uniform M2 depth distribution. This is a direct result of the layer by layer (cycle by cycle) deposition. Moreover, for thin films (e.g. less than 5 nm), a low number of relatively thick supercycles results in poor M2 cation % controllability, and ultimately, in an inability to achieve the desired low M2 cation %. In effect, there is a minimum floor to the M2 concentration that can be achieved for a given film stack thickness, because at least a single M2 layer is required using conventional ALD.

Turning now to an overview of the aspects of the invention, embodiments of the invention provide a new ALD technique for depositing thin-film ternary oxides. In this process the M2 pulses occur right after the M1 pulses, without intervening oxidant (or other reactant) pulses. The chemisorbed M1 and its remaining ligands block some or all of the adsorption/reaction sites, reducing the M2 uptake during the subsequent M2L2 pulse. The M2 uptake is further tuned by carefully selecting different precursor ligands having different relative sizes to modify how much of the substrate surface will be exposed to the second precursor (or viewed alternatively, how much of the substrate surface is blocked by the first precursor ligands).

Consider the deposition of ALD metal precursors P1 and P2, where P1 includes a first metal and a first ligand (e.g., M1La) and P2 includes a second metal and a second ligand (e.g., M2Lb). In some embodiments of the invention, the M2Lb pulses occur right after M1La pulses, without an intervening oxidant (or other reactant) pulse. In some embodiments of the invention, the first ligand La and the second ligand Lb are selected such that the first ligand La is relatively small and the second ligand Lb is relatively large. For example, the first ligand La can be a relatively small chloride (e.g., $Cl_4$ or $Cl_3$) and the second ligand Lb can be a relatively large metalorganic molecule (e.g., a trimethyl metalorganic or a tetramethylethyl metalorganic, such as $Al_2(CH_3)_6$). In some embodiments of the invention, ligands having specific differences in relative size are selected to achieve a targeted M2 uptake.

As shown in FIG. 2, selecting the ligands in this manner can reduce M2 uptake by 80% or more (80%, 85%, 90%, 95%, 99%, or even completely), without changing the number of supercyles. For example, a TEMAZr pulse followed by an HfCl4 pulse for 80 cycles (split 5) provides an Hf concentration of about 48.6 percent, while a TEMAZr pulse followed by a TEMAHf pulse for 80 cycles (split 7) provides an Hf concentration of about 27.2 percent. Notably, this wide range of Hf concentrations (M2 uptake) were achieved without varying the number of cycles.

Benefits of this technique over prior ALD processes include the ability to form conformal and uniform thin-film ternary oxides having a more uniform M2 depth distribution. Moreover, decoupling the M2 cation % from the number of needed supercycles improves M2 cation % controllability and allows for lower M2 concentrations, even for very thin (sub 5 nm) films.

ALD techniques in accordance with aspects of the invention have a wide range of practical applications, such as in metal-insulator-metal (MIM) stacks, 3D memory oxides, 3D flash devices, resistive random access memory (RRAM), or in high-k dielectric films, such as those used in FETs and MIMCAPs. For example, ALD processes in accordance with aspects of the invention can be used to build $M:HfO_2$ or $M:ZrO_2$ high-k dielectric films having arbitrarily low cation % M (e.g., 3-15% or even sub 3%) even for very thin film thicknesses of 0.5 to 10 nm. These films can be used to build DRAM, MIMCAP, FET, or RRAM devices, among other applications. In another example, ALD processes in accordance with aspects of the invention can be used to form thin Al-doped $ZrO_2$ films (e.g., for DRAMs). These ALD processes can also be used to form ferroelectric or anti-ferroelectric films. For example, $M:HfO_2$ or $M:ZrO_2$ films with 2-6 cation % M (M can include any suitable metal or semiconductor material, such as Si, Al, Mg, La, Gd, Sr, etc.) can be incorporated in a broad range of devices, such as FeFET, FeRAM, MIMCAP, DRAM, ferroelectric tunnel junction (FTJ), FeFET (memory or logic), or RRAM.

Figure 3:
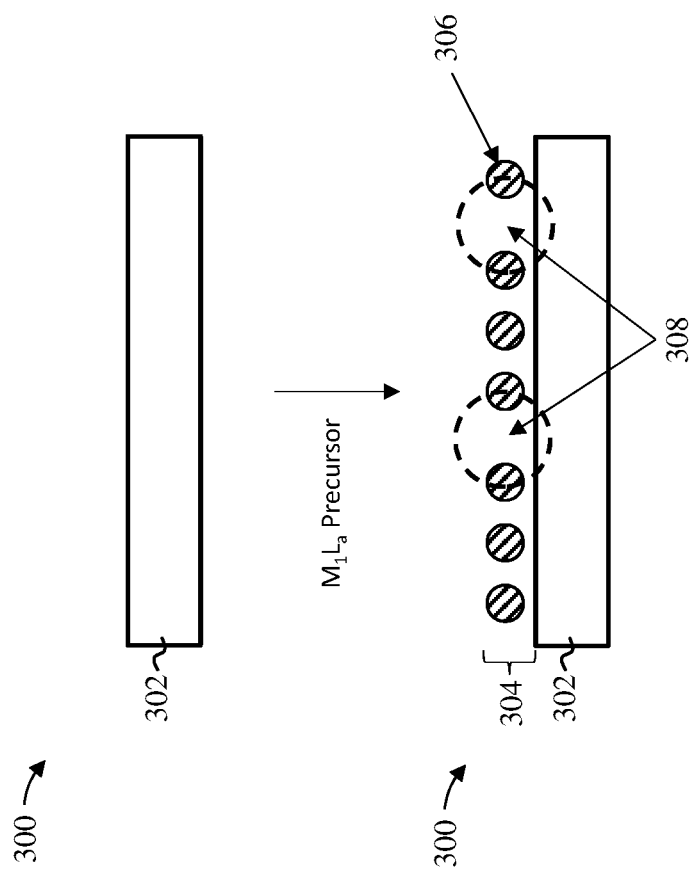
FIG. 3 depicts a cross-sectional view illustrating a structure that results from performing initial fabrication operations in accordance with embodiments of the invention.

Turning now to a more detailed description of aspects of the present invention, FIGS. 3-6 depict cross-sectional views of a portion of a semiconductor wafer/structure 300 that includes a substrate 302 after fabrication operations for forming a ternary oxide film (shown in FIG. 6) from an ALD process using M1La-M2Lb-O cycles according to embodiments of the invention. More specifically, FIG. 3 depicts a cross-sectional view illustrating two instances of an initial wafer/structure/substrate 302 that result from performing initial fabrication operations in accordance with embodiments of this invention.

As shown in FIG. 3, a substrate 302 (the topmost image) is formed using known semiconductor fabrication techniques, and a surface of the substrate 302 is exposed to a first precursor M1La to form a first ALD layer 304 during a first pulse of an ALD cycle as shown in the bottommost image of the substrate 302. In some embodiments of the invention, the first ALD layer 304 includes the chemisorbed metal 306 of the first precursor M1La and its remaining ligands. The first precursor M1La and its remaining ligands can block some or all of the adsorption/reaction sites. In some embodiments of the invention, one or more adsorption sites 308 remain open on the surface of the substrate 302. In some embodiments of the invention, the first pulse only results in the deposition of a single layer of the chemisorbed metal 306.

The substrate 302 can be made of any suitable substrate material, such as, for example, silicon, silicon germanium, silicon carbide (SiC), amorphous doped silicon (e.g., aSi:H), Group III-V compound semiconductor, Group II-VI compound semiconductor, or semiconductor-on-insulator (SOI). Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. Group II-IV compound semiconductors include materials having at least one group II element and at least one group IV element, in a similar manner as Group III-V compound semiconductors. In some embodiments of the invention, the substrate 302 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

The first precursor M1La can include a metal (M1) and a ligand (La). The metal can include any suitable material (even nonmetal semiconductors), such as, for example, Hf, Ta, Zr, Al, La, Si, etc. The ligand can include any suitable material, such as, for example, halides, a chloride ($Cl_4$ or $Cl_3$), or a metalorganic (trimethyl metalorganics, tetramethylethyl metalorganic, etc., such as $Al_2(CH_3)_6$).

While not illustrated for ease of discussion, in some embodiments of the invention, the first pulse (and in fact, any of the pulses, including all precursor and oxidant pulses) is followed by a non-reactive purge pulse. The purge pulse does not affect the final chemistry, and a detailed discussion of the purge pulses is omitted for simplicity. The purge pulses can include, for example, $N_2$, Ar, He, vacuum, etc., and can be used to purge off-gasses and unreacted precursor gasses.

Figure 4:
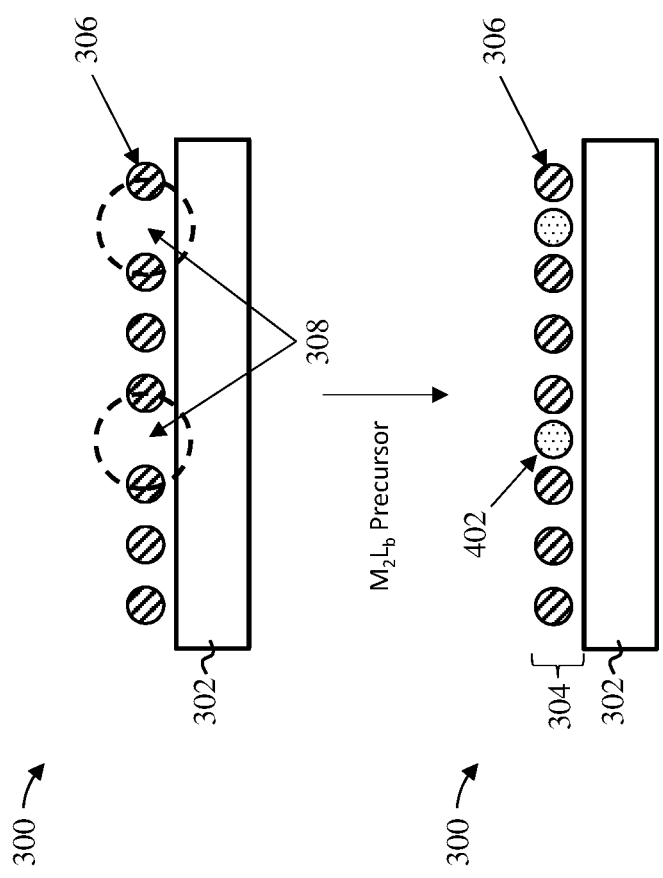
FIG. 4 depicts a cross-sectional view of the structure after fabrication operations in accordance with embodiments of the invention.

FIG. 4 depicts a cross-sectional view illustrating two instances of the semiconductor structure 300 after processing operations according to one or more embodiments of the invention. As illustrated in FIG. 4, the surface of the substrate 302 (the topmost image) is exposed to a second precursor M2Lb to fill in any (some, or all) of the one or more adsorption sites 308 in the first ALD layer 304 during a second pulse of an ALD cycle (as shown in the bottommost image). In some embodiments of the invention, the second precursor M2Lb includes a different material (M2) than the first precursor M1La. In some embodiments of the invention, the second precursor M2Lb includes a different ligand (Lb) than the first precursor M1La.

In some embodiments of the invention, the different ligands La and Lb correspond to distinct halides and metalorganic ligands, including amines and carbo-hydrates. In some embodiments of the invention, the first ligand La and the second ligand Lb are selected from a same class of ligands (e.g., both are halides, metalorganics, etc.). In some embodiments of the invention, the first ligand La is selected from a first class of ligands (e.g., a halide) and the second ligand Lb is selected from a second class of ligands (e.g., a metalorganic). For example, the metal M1 can be hafnium (Hf), the metal M2 can be zirconium (Zr) and the different precursors can include a combination of $ZrCl_4$, $HfCl_4$, TEMAHf, and TDMAHf, TDMAZr, etc., depending on the application.

In some embodiments of the invention, the first ligand La of the first precursor M1La reacts with the second ligand Lb of the second precursor M1Lb during the second pulse. In some embodiments of the invention, the reacted ligands La and Lb form an off-gas that is removed from the semiconductor structure 300. In some embodiments of the invention, what remains in the first ALD layer 304 after off-gassing are the metals M1 and M2 and some residuals (unreacted ligands and reaction byproducts such as N, Cl, C, H).

In some embodiments of the invention, the first ALD layer 304 includes the chemisorbed metal 306 of the first precursor M1La, the chemisorbed metal 402 of the second precursor M2Lb, and any remaining (unreacted) ligands. As discussed previously herein, the first precursor M1La and its remaining ligands can block some or all of the adsorption sites 308 during the first pulse. In some embodiments of the invention, the second pulse immediately follows the first pulse.

By performing the second pulse right after the first pulse (i.e., by exposing the substrate 302 directly to the second precursor M2Lb without an oxidant pulse), the M2Lb uptake will be self-limited to the available reaction sites (e.g., the one or more open adsorption sites 308). In this manner, the first ALD layer 304 can be formed sub-stoichiometrically. In some embodiments of the invention, the chemisorbed metal 402 of the second precursor M1Lb reacts with the chemisorbed metal 306 of the first precursor M1La. In other words, the first ALD layer 304 can be a sub-oxide having M1-M2 metallic bonds.

As discussed previously herein, the relative sizes of the first ligand La and the second ligand Lb can be selected to achieve a target M2 uptake. In some embodiments of the invention, a relatively small (with respect to the first ligand La) second ligand Lb is selected to increase the M2 uptake. Without wishing to be bound by theory, the smaller Lb ligands are more easily able to access the one or more open adsorption sites 308. In some embodiments of the invention, a relatively large (with respect to the first ligand La) second ligand Lb is selected to decrease the M2 uptake. Without wishing to be bound by theory, the larger Lb ligands have difficulty accessing the one or more open adsorption sites 308.

In some embodiments of the invention, experiments are made for a range of possible first and second ligands over a same number of cycles and the M2 uptake is measured in each case. In some embodiments of the invention, a list or database of achieved M2 uptake concentrations is generated for the various combinations of first and second ligands. In some embodiments of the invention, the order of the M1 and M2 deposition pulses are swapped. An example list of possible ligands and the resulting M2 uptake for depositing an HfZr ternary oxide is shown in FIG. 2. It is understood, however, that different lists having any number of ligand combinations for any arbitrary metals (M1 and M2 selections) can be generated using this experimental method. Once a selection of possible first and second ligands are their corresponding M2 uptake concentrations are known, the actual first and second ligands can be selected to target a specific M2 uptake.

In some embodiments of the invention, the first and/or second ligands can be swapped out after finishing a partial portion of the total cycles to further refine the M2 uptake percent. For example, if a first selection of ligands (L1 and L2) provides 40% M2 uptake and a second selection of ligands (L3 and L4) provides 20% M2 uptake, then forming the first half of the film stack using the first selection of ligands and then finishing the film stack using the second selection of ligands will result in an M2 uptake of about 30%. Notably, this can be achieved without changing the number of cycles or final film thickness.

Figure 5:
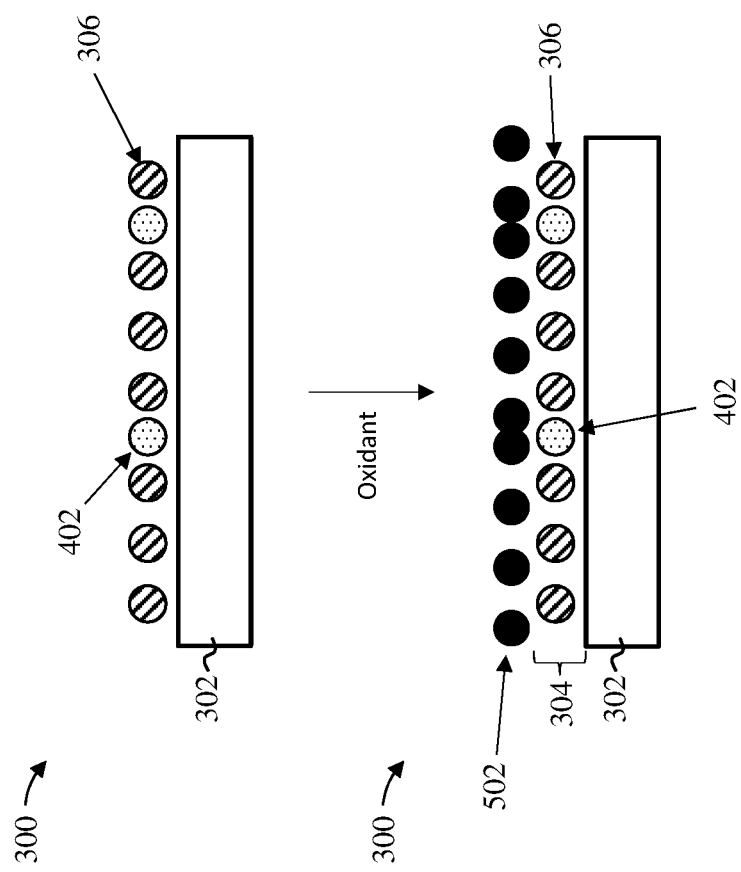
FIG. 5 depicts a cross-sectional view of the structure after fabrication operations in accordance with embodiments of the invention.

FIG. 5 depicts a cross-sectional view illustrating two instances of the semiconductor structure 300 after a processing operation according to one or more embodiments of the invention. As illustrated in FIG. 5, the surface of the first ALD layer 304 is exposed to an oxidant (denoted "O") during an oxidant pulse of the ALD cycle (as shown in the bottommost image). In some embodiments of the invention, the oxidant O can include, for example, $H_2O$, $N_2O$, NO, $O_3$, $O_2$, etc. In some embodiments of the invention, the oxidant pulse results in a single oxidant layer 502 forming on a surface of the first ALD layer 304.

FIG. 6 depicts a cross-sectional view illustrating two instances of the semiconductor structure 300 after a processing operation according to one or more embodiments of the invention. As illustrated in FIG. 6, the semiconductor structure 300 is exposed to "X" repeated cycles of the ALD pulse (M1La-M2Lb-O) depicted in FIGS. 3-5 to build additional layers 602 (as shown in the bottommost image).

In some embodiments of the invention, the layers 602 are built by sequentially exposing the surface of the substrate 302 to: (1) a pulse of the first precursor M1La to form an ALD layer (as described with respect to FIG. 3); (2) a pulse of the second precursor M2Lb to fill in any (some, or all) of one or more adsorption sites in the ALD layer (as described with respect to FIG. 4); (3) an oxidant pulse (as described with respect to FIG. 5); and (4) repeating as needed. The layers 602 can be formed to any arbitrary thickness by increasing the number "X" of the repeated M1La-M2Lb-O cycles as desired.

Figure 7A:
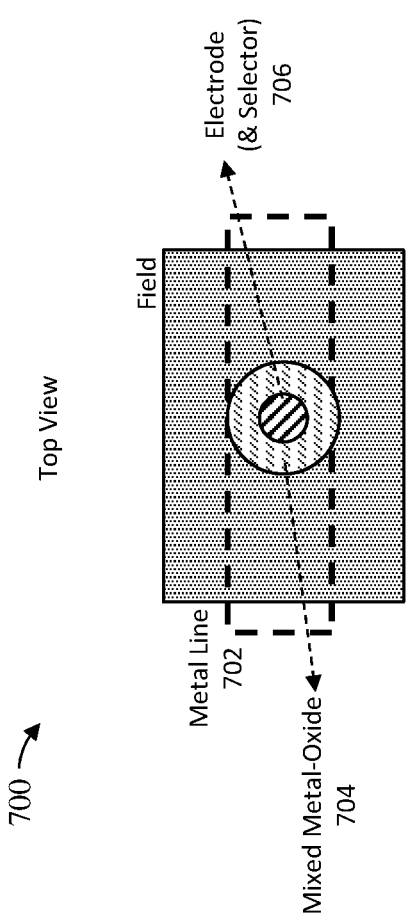
FIG. 7A depicts a top-down view of a structure after fabrication operations in accordance with embodiments of the invention.
Figure 7B:
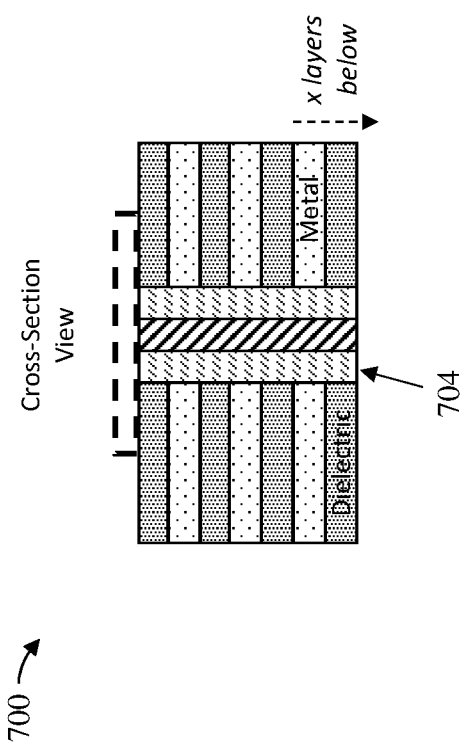
FIG. 7B depicts a cross-sectional view of the structure of FIG. 7A after fabrication operations in accordance with embodiments of the invention.

FIGS. 7A and 7B depict top-down and cross-sectional views, respectively, of a semiconductor structure 700 after a processing operation according to one or more embodiments of the invention. As illustrated in FIG. 7A, the semiconductor structure 700 can define part of a MIM structure (e.g., planar X-point or stacked 3D RRAM). The semiconductor structure 700 can include, for example, a metal line 702, an ALD ternary oxide 704, and an electrode 706. The metal line 702 and the electrode 706 can be formed using known processes. In some embodiments of the invention, the ALD ternary oxide 704 is formed according to one or more embodiments of the invention. In some embodiments of the invention, the ALD ternary oxide 704 is formed sequentially using M1La-M2Lb-O) cycles. In some embodiments of the invention, the La and Lb ligands are selected to achieve a particular M2 uptake, as discussed previously herein.

The semiconductor structure 700 illustrates one possible application for the ternary oxides formed using the previously described techniques in accordance with one or more embodiments. It is understood, however, that the previously described techniques can be incorporated in other processes. Advantageously, this ternary oxide ALD technique can replace or supplement any FEOL or BEOL process whereby oxide films or sub-oxide films are needed (e.g., the high-k dielectric film in FETs, the insulator of a MIMCAP, etc.). In another example, the silicon nitride in a 3D charge-trap flash memory is replaced with an ALD ternary oxide film (e.g., MO—N,C,H,Cl) formed according to one or more embodiments of the invention.

FIG. 8 depicts a flow diagram 800 illustrating a method for depositing a compound (e.g., a ternary oxide film) according to one or more embodiments of the invention. As shown at block 802, a first precursor is selected. The first precursor can include a first metal and a first ligand. At block 804, a second precursor is selected. The second precursor can include a second metal and a second ligand. The second metal is different than the first metal. In some embodiments of the invention, the second ligand is selected based on the first ligand to target a second metal uptake, as discussed previously herein.

In some embodiments of the invention, the first metal and the second metal include one or more of Hf, Ta, Zr, Al, La, and Si. In some embodiments of the invention, the first ligand and the second ligand are selected from a same class (e.g., both chlorides). In some embodiments of the invention, the first ligand and the second ligand are selected from a different class (e.g., one chloride and one halide). In some embodiments of the invention, the first ligand includes a halide and the second ligand includes a metalorganic. In some embodiments of the invention, the first ligand includes a metalorganic and the second ligand includes a halide. As shown in FIG. 2, varying the order of the ligand classes (e.g., a halide first vs. a metalorganic first) can result in a change to the M2 uptake. In some embodiments of the invention, the order of the ligand classes is swapped to further tune the M2 uptake.

At block 806, a substrate is exposed to the first precursor during a first pulse of an ALD cycle. In some embodiments of the invention, during the first pulse the first metal of the first precursor chemisorbs onto a surface of the substrate. In some embodiments of the invention, one or more adsorption sites remain open after the first pulse.

At block 808, the substrate is exposed to the second precursor during a second pulse of the ALD cycle. In some embodiments of the invention, the second pulse occurs directly after the first pulse. In some embodiments of the invention, the second pulse occurs after the first pulse such that any intervening pulse is a non-reactive purge pulse (e.g., without an intervening oxidant pulse).

In some embodiments of the invention, during the second pulse the second metal of the second precursor chemisorbs onto the one or more open adsorption sites which remain open after the first pulse. In some embodiments of the invention, the metal of the second precursor chemisorbs onto a coated surface terminated by the first precursor ligands.

In some embodiments of the invention, the first ligand and the second ligand react during the second pulse to form one or more byproducts. In some embodiments of the invention, at least a portion of the one or more byproducts are removed via off-gassing.

At block 810, the substrate is exposed to a third precursor during a third pulse of the ALD cycle. In some embodiments of the invention, the ternary compound includes a ternary oxide film and the third precursor includes an oxidant.

In some embodiments of the invention, a precursor partial pressure, gas flow, and pulse time are selected for at least one of the first pulse and the second pulse based on the target second metal uptake. In some embodiments of the invention, these parameters are modified to further tune the M2 uptake. M2 uptake can vary based on the underlying chemisorbsion mechanisms (i.e., the ratio of M2 chemisorbsion to open sites versus chemisorbsion to M1 ligands). As the M1La pulse time increases, chemisorbsion to open sites decreases (due in part to the first precursor taking more and more of the previously open sites). Note that as the first pulse time trends towards infinite, M2 uptake decreases to a limit that is based on the physical size of the M1La compound).

Moreover, while the formation of a ternary compound (e.g., a ternary oxide film having a first metal, a second metal, and an oxidant) is described in detail for ease of discussion, it is understood that ALD processes in accordance with aspects of the invention can be used to form compounds having any number of elements. In some embodiments of the invention, new precursors having different metals and/or ligands can be deposited over the initial film layer(s). In this manner, films having compounds with any number of elements can be formed.

Figure 9:
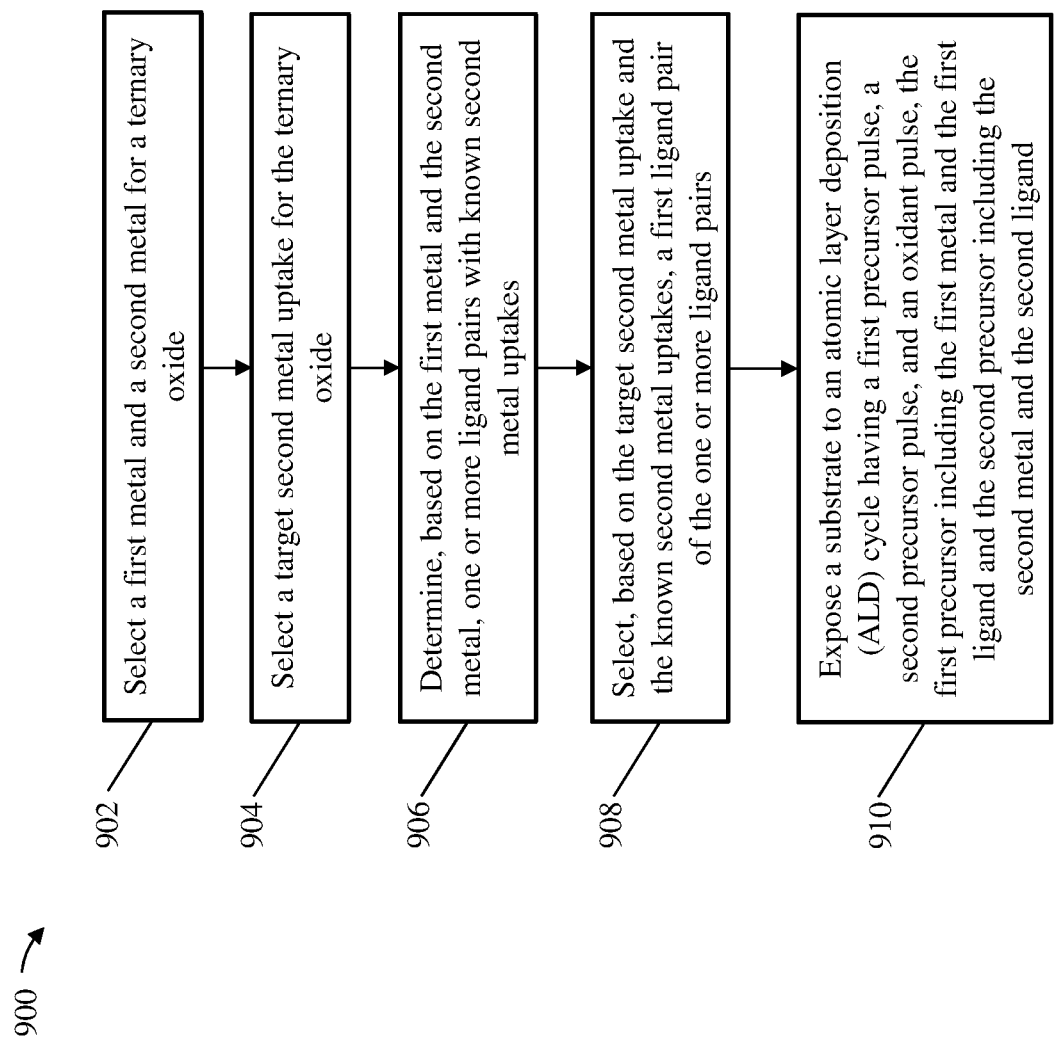
FIG. 9 depicts a flow diagram illustrating a method according to one or more embodiments of the invention.

FIG. 9 depicts a flow diagram 900 illustrating a method for forming a ternary oxide according to one or more embodiments of the invention. As shown at block 902, a first metal and a second metal are selected for the ternary oxide. For example, the first metal can be Hf and the second metal can be Zr, although other metal selections are within the contemplated scope of the invention.

At block 904, a target second metal uptake is selected for the ternary oxide, as discussed previously herein. The target second metal uptake can vary depending on the application, and can range from 0.5% to 99%. In some embodiments of the invention, the target second metal uptake is less than 15%, less than 10%, less than 5%, less than 3%, less than 2%, or less than 1%.

At block 906, one or more ligand pairs with known second metal uptakes are determined and stored for later selection based on the first metal and the second metal. As discussed previously herein, any number of ligand pairs and associated second metal uptake percentages can be experimentally determined for any number of first metal/second metal pairs. In this manner, a range of possible ligand pairs with known second metal uptake percentages can be determined for a range of metal-metal combinations.

At block 908, a first ligand pair of the one or more ligand pairs is selected, based on the targeted second metal uptake and the known second metal uptakes. For example, if the first metal is Hf, the second metal is Zr, and a target Zr uptake is 15%, the first ligand can be $Cl_4$ and the second ligand can be TEMA. As shown in FIG. 2, this selection results in a Zr uptake of about 15.6%. While this particular example is developed for ease of discussion, other metal and ligand combinations, and targeted second metal uptakes, are possible.

At block 910, a substrate is exposed to an ALD cycle. The ALD cycle can include a first precursor pulse, a second precursor pulse, and an oxidant pulse. The first precursor can include the first metal and the first ligand and the second precursor can include the second metal and the second ligand.

In some embodiments of the invention, the method further includes selecting, based on the target second metal uptake and the known second metal uptakes, a second ligand pair of the one or more ligand pairs. The second ligand pair can include a third ligand and a fourth ligand. As discussed previously herein, the second ligand pair can be combined with the first ligand pair to further tune the second metal uptake.

In some embodiments of the invention, the ALD cycle is a first ALD cycle and only a first portion of the ternary oxide is formed using the first ALD cycle. In some embodiments of the invention, a second portion of the ternary oxide is formed using a second ALD cycle. In some embodiments of the invention, the second ALD cycle includes a third precursor pulse, a fourth precursor pulse, and an oxidant pulse. The third precursor can include the first metal and the third ligand, and the fourth precursor can include the second metal and the fourth ligand.

Forming the ternary oxide from two successive ALD cycles having different ligand pairs offers some advantages over a single ALD cycle. One advantage is that the M2 cation % can change within the ternary oxide film (i.e., the first portion can have a first uptake, and the second portion can have a different uptake). In other words, the ternary oxide film can have a gradient of M2 concentrations. This process can be expanded to cover any number of successive ALD cycles, each having a different ligand pair selection (but the same first metal and second metal). In this manner, the resulting ternary oxide film can have any number of layers, each having a different M2 concentration. This approach results in a nanolaminate type structure with layer by layer M1/M2 cation concentration percentages that vary laterally through the film (and having any arbitrary gradient), resulting in a film composition that differs considerably from nanolaminates made using conventional ALD (i.e., where each layer is either M1 or M2, as shown in FIG. 1).

In some embodiments of the invention, the first ligand is selected from a first class of ligands (e.g. a halide, a chloride, a metalorganic, etc.) and the second ligand is selected from a second class of ligands different than the first class.

In some embodiments of the invention, the ternary oxide includes a ferroelectric phase or an anti-ferroelectric phase.

Figure 10:
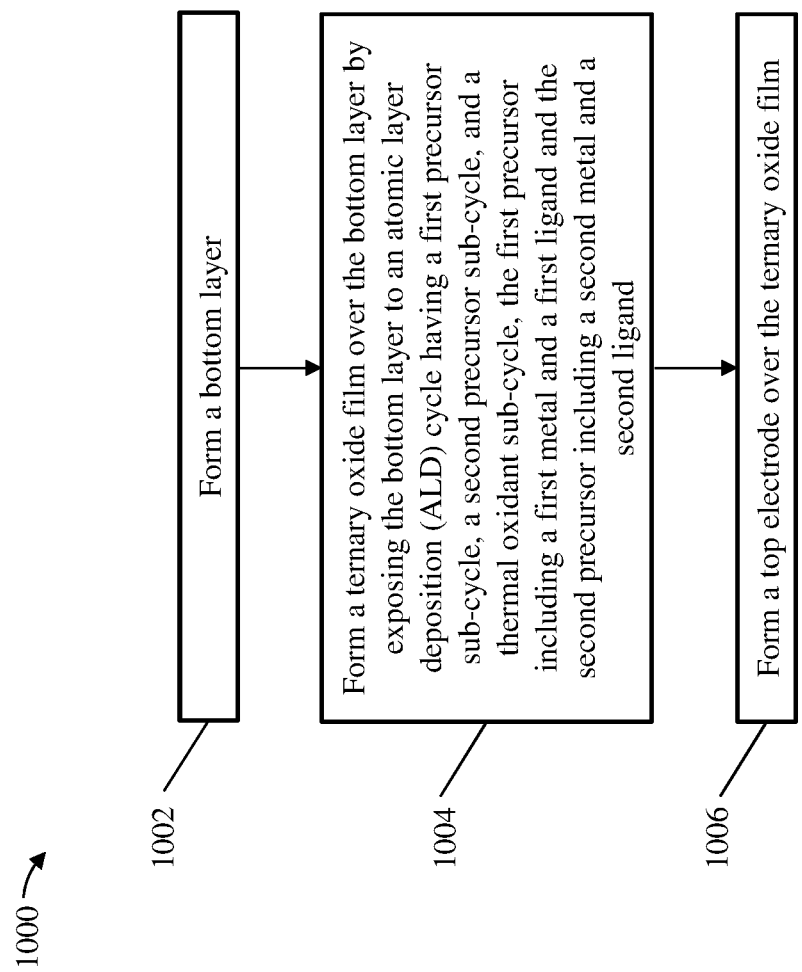
FIG. 10 depicts a flow diagram illustrating a method according to one or more embodiments of the invention.

FIG. 10 depicts a flow diagram 1000 illustrating a method for forming an electronic device according to one or more embodiments of the invention. As shown at block 1002, a bottom layer is formed. In some embodiments of the invention, the bottom layer includes a semiconductor material. In some embodiments of the invention, the semiconductor material includes one or more of Si, Ge, SiGe, aSi:H, and InGaAs. In some embodiments of the invention, the bottom layer includes a bottom electrode. In some embodiments of the invention, the bottom electrode includes a metal. In some embodiments of the invention, the bottom electrode includes a metal-nitride and the metal-sub-oxide film includes $HfO_{2-x}$ or $Ta_2O_{3-x}$.

At block 1004, a ternary oxide film is formed over the bottom layer. The ternary oxide film can formed by exposing the bottom layer to an ALD cycle having a first precursor pulse, a second precursor pulse, and an oxidant pulse. The first precursor can include a first metal and a first ligand and the second precursor can include a second metal and a second ligand. The second ligand can be selected based on the first ligand to target a second metal uptake, as discussed previously herein.

In some embodiments of the invention, the ternary oxide film includes a thickness of less than about 2 nm and a second metal concentration of less than 15 percent. In some embodiments of the invention, the second metal is distributed throughout the ternary oxide film. In other words, the second metal is not confined to dedicated layers as is the case for conventional ALD (see FIG. 1).

At block 1006, a top electrode is formed over the bottom layer. In some embodiments of the invention, the ternary oxide film is an active area of a resistive random-access memory (RRAM). In some embodiments of the invention, the ternary oxide film is a gate dielectric layer of a floating gate flash memory. In some embodiments of the invention, the ternary oxide film includes one or more metal-metal bonds and/or one or more metal-nitride-metal bonds. In some embodiments of the invention, the ternary oxide film includes sub-oxide bonds coupled with organic and halide byproducts (e.g., C, Cl, $NH_3Cl$, etc.). The presence of these sub-oxide bonds coupled with organic and halide byproducts can serve as a fingerprint when determining whether a particular ternary oxide film was formed according to one or more embodiments of the present invention.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a ternary oxide, the method comprising:
   selecting a first metal and a second metal for the ternary oxide;
   selecting a target second metal uptake for the ternary oxide, wherein the target second metal uptake comprises a final second metal concentration in the ternary oxide;
   determining, for the selected first metal and second metal, a list of possible second metal uptakes for two or more ligand pairs, wherein each ligand pair comprises a combination of one ligand for the first metal and one ligand for the second metal;
   selecting, based on the target second metal uptake and the list of possible second metal uptakes, a first ligand pair of the two or more ligand pairs, the first ligand pair comprising a first ligand and a second ligand; and
   exposing a substrate to an atomic layer deposition (ALD) cycle, the ALD cycle comprising a first precursor pulse, a second precursor pulse, and an oxidant pulse, wherein the first precursor pulse comprises the first metal and the first ligand and the second precursor pulse comprises the second metal and the second ligand.

2. The method of claim 1 further comprising selecting, based on the target second metal uptake and the known second metal uptakes, a second ligand pair of the one or more ligand pairs, the second ligand pair comprising a third ligand and a fourth ligand.

3. The method of claim 2, wherein the ALD cycle is a first ALD cycle, and wherein a first portion of the ternary oxide is formed using the first ALD cycle and a second portion of the ternary oxide is formed using a second ALD cycle.

4. The method of claim 3, wherein the second ALD cycle comprises a third precursor pulse, a fourth precursor pulse, and an oxidant pulse, wherein the third precursor pulse comprises the first metal and the third ligand and the fourth precursor pulse comprises the second metal and the fourth ligand.

5. The method of claim 1, wherein the first ligand is selected from a first class of ligands and the second ligand is selected from a second class of ligands different than the first class.

6. The method of claim 1, wherein the ternary oxide comprises a ferroelectric phase.

7. A method for forming an electronic device, the method comprising:
- forming a bottom layer;
- forming a ternary oxide film over the bottom layer, the ternary oxide film formed by exposing the bottom layer to an atomic layer deposition (ALD) cycle, the ALD cycle comprising a first precursor pulse, a second precursor pulse, and an oxidant pulse, wherein the first precursor pulse comprises a first metal and a first ligand and the second precursor pulse comprises a second metal and a second ligand; and
- forming a top electrode over the ternary oxide film;
- wherein the second ligand is selected, based on the first ligand, to target a second metal uptake, wherein the targeted second metal uptake comprises a final second metal concentration in the ternary oxide film.

8. The method of claim 7, wherein the bottom layer comprises a metal and the ternary oxide film comprises an active area of a ferroelectric device or a resistive random-access memory (RRAM).

9. The method of claim 7, wherein the ternary oxide film comprises a thickness of less than about 2 nm and a second metal concentration of less than 15 percent, and wherein the second metal is distributed throughout the ternary oxide film.

* * * * *